(12) United States Patent
Hizukuri et al.

(10) Patent No.: US 7,156,281 B2
(45) Date of Patent: Jan. 2, 2007

(54) BONDING DEVICE AND BONDING TOOL

(75) Inventors: Masafumi Hizukuri, Tosu (JP); Seiji Takahashi, Munakata-gun (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 97 days.

(21) Appl. No.: 10/829,653

(22) Filed: Apr. 22, 2004

(65) Prior Publication Data

US 2004/0211812 A1    Oct. 28, 2004

(30) Foreign Application Priority Data

Apr. 23, 2003    (JP)    ............................. 2003-118278

(51) Int. Cl.
B23K 31/02    (2006.01)

(52) U.S. Cl. ..................... 228/110.1; 228/1.1

(58) Field of Classification Search ............. 228/110.1, 228/1.1, 180.5
See application file for complete search history.

(56) References Cited

U.S. PATENT DOCUMENTS

| | | | |
|---|---|---|---|
| 4,534,811 A * | 8/1985 | Ainslie et al. ............. 156/73.1 |
| 5,142,117 A * | 8/1992 | Hoggatt et al. .......... 219/85.16 |
| 5,240,166 A * | 8/1993 | Fontana et al. .......... 228/111.5 |
| 5,397,407 A * | 3/1995 | D'Addario ................. 156/73.1 |
| 6,564,988 B1 * | 5/2003 | Shiraishi et al. ......... 228/110.1 |
| 2003/0038158 A1 | 2/2003 | Takahashi et al. |
| 2003/0066863 A1 | 4/2003 | Skogsmo et al. |

FOREIGN PATENT DOCUMENTS

| | | |
|---|---|---|
| EP | 0 761 371 A1 | 3/1997 |
| JP | 2000-200961 | 7/2000 |
| WO | WO 3/081644 A2 | 10/2003 |

* cited by examiner

*Primary Examiner*—Jonathan Johnson
(74) *Attorney, Agent, or Firm*—Pearne & Gordon LLP (57) ABSTRACT

A bonding device is for bonding an object to be bonded under pressure to a surface to be bonded by allowing a load and vibration to act on the object to be bonded. The bonding device includes a bonding tool 14 abutting on the object to be bonded, and a pressing unit pressing the bonding tool to the object to be bonded. The bonding tool includes a transversely elongated horn, a vibrator 17 applying a longitudinal vibration to the horn 15 in a first direction along the longitudinal direction of the horn a protruding part 30 protruding from the horn in a second direction substantially perpendicular to the first direction, a bonding operation part 31 provided in the end part of the protruding part 30 to abut on the object to be bonded, and a heating unit inserted into a mounting hole provided in the horn. The heating unit is mounted into the mounting hole with a space maintained from the inner surface of the mounting hole.

12 Claims, 5 Drawing Sheets

BONDING DEVICE AND BONDING TOOL

BACKGROUND OF THE INVENTION

1. Field of the Invention

The present invention relates to a bonding device and a bonding tool for electronic parts for bonding an object to be bonded such as the electronic parts to a surface to be bonded such as an electrode of a board.

2. Description of the Related Art

As a method for bonding an object to be bonded such as electronic parts to a surface to be bonded such as an electrode of a board, a method using an ultrasonic pressure welding is known. According to this method, while the electronic parts are pressed to the surface to be bonded, an ultrasonic vibration is applied to the electronic parts to fractionally vibrate the surface to be bonded and to allow the surface to be bonded to come in to close contact with the electronic parts. The bonding tool used in this method has an elongated horn for transmitting the vibration of a vibration generation source to the electronic parts. While a load and a vibration are allowed to act on the electronic parts by a bonding operation part provided in this horn, the electronic parts are allowed to come into contact under pressure with the surface to be bonded. Thus, the electronic parts are bonded to the surface to be bonded.

As such a bonding tool, a bonding tool having a heater incorporated in a horn has been known. Thus, electronic parts can be advantageously heated through a bonding operation part upon boding so that a bonding efficiency can be improved. As a method for mounting such a heater on the horn, a method has been hitherto employed that a rod shaped heater is inserted and fixed to a mounting hole provided in the direction perpendicular to the longitudinal direction of the horn (for instance, see JP-A-2000-200961 (FIG. 3)).

In bonding the electronic parts, to assure a stable bonding quality, the propagation characteristics of the ultrasonic vibration transmitted to the horn from the vibration generation source need to be stabilized to constantly apply a stable vibration to the electronic parts. However, when the above-described usual method for mounting the heater is directly applied to the bonding tool for which the stable vibration characteristics are requested, such problems as described below arise.

Firstly, in the usual structure, since the rod shaped heater is inserted transversely in a vibration propagating direction, the propagation of vibration is apt to be interrupted by the heater. Especially, when a large heater is combined with a horn of a small size employed for compact electronic parts, the above-described influence obviously occurs. Accordingly, in the usual bonding tool, a heating operation with high efficiency has been hardly compatible with the realization of stable vibration characteristics.

Further, in the usual structure, while the rod shaped heater is inserted into the mounting hole, the heater is fixed to the horn. Thus, the heater is always pressed to the inner surface of the mounting hole. However, contact pressure under which the heater is pressed to the inner surface of the mounting hole is not always constant and frequently changes due to a temperature change or the unfastened state of fastening means. Accordingly, the rigidity distribution of the whole of the horn is sometimes varied so that stable vibration characteristics may not be undesirably held.

SUMMARY OF THE INVENTION

Thus, it is an object of the present invention to provide a bonding device and a bonding tool that can realize stable vibration characteristics.

A bonding device defined in claim 1 is a device for bonding an object to be bonded under pressure to a surface to be bonded by allowing a load and vibration to act on the object to be bonded. The bonding device comprises:

a bonding tool abutting on the object to be bonded and a pressing unit for pressing the bonding tool to the object to be bonded. The bonding tool includes a transversely elongated horn, a vibrator for applying a longitudinal vibration to the horn in a first direction along the longitudinal direction of the horn, a protruding part protruding from the horn in a second direction substantially perpendicular to the first direction, a bonding operation part provided in the end part of the protruding part to abut on the object to be bonded and a heating unit inserted into a mounting hole provided in the horn. The heating unit is mounted into the mounting hole with a space maintained between the inner surface of the mounting hole and the heating unit.

A bonding device defined in claim 2 is characterized in that a vent part is provided for preventing the transfer of heat to the vibrator in the horn between the vibrator and the bonding operation part.

A bonding device defined in claim 3 is characterized in that the vent part is a transversely elongated slit in the first direction.

A bonding device defined in claim 4 is characterized in that the heating unit is provided in a part corresponding to an antinode of the vibration of the horn.

A bonding tool defined in claim 5 is a tool for bonding an object to be bonded under pressure to a surface to be bonded by allowing a load and vibration to act on the object to be bonded. The bonding tool comprises: a transversely elongated horn; a vibrator for applying a longitudinal vibration to the horn in a first direction along the longitudinal direction of the horn; a protruding part protruding from the horn in a second direction substantially perpendicular to the first direction; a bonding operation part provided in the end part of the protruding part to abut on the object to be bonded; and a heating unit inserted into a mounting hole provided in the horn. The heating unit is mounted into the mounting hole with a space maintained between the inner surface of the mounting hole and the heating unit.

A bonding tool defined in claim 6 is characterized in that a vent part is provided for preventing the transfer of heat to the vibrator in the horn between the vibrator and the bonding operation part.

A bonding tool defined in claim 7 is characterized in that the vent part is a transversely elongated slit in the first direction.

A bonding tool defined in claim 8 is characterized in that the heating unit is provided in a part corresponding to an antinode of the vibration of the horn.

A bonding tool defined in claim 9 is a tool for bonding an object to be bonded under pressure to a surface to be bonded by allowing a load and vibration to act on the object to be bonded, the bonding tool. The bonding tool comprises: a transversely elongated horn, a vibrator applying a longitudinal vibration to the horn in a first direction along the longitudinal direction of the horn, a protruding part protruding from the horn in a second direction substantially perpendicular to the first direction, a bonding operation part, provided in the end part of the protruding part to abut on the object to be bonded and, a rod shaped heating unit, inserted into the first direction of the horn.

A bonding tool defined in claim 10 is characterized in that a vent part is provided for preventing the transfer of heat to the vibrator in the horn between the vibrator and the bonding operation part.

A bonding tool defined in claim 11 is characterized in that the vent part is a transversely elongated slit in the first direction.

A bonding tool defined in claim 12 is characterized in that the heating unit is provided in a part corresponding to an antinode of the vibration of the horn.

According to the present invention, the heating unit is inserted into the first direction of the horn, or the heating unit is mounted in the mounting hole with a space maintained between the inner surface of the mounting hole and the heating unit. Accordingly, stable vibration characteristics can be realized.

DESCRIPTION OF THE PREFERRED EMBODIMENTS

Figure 1:
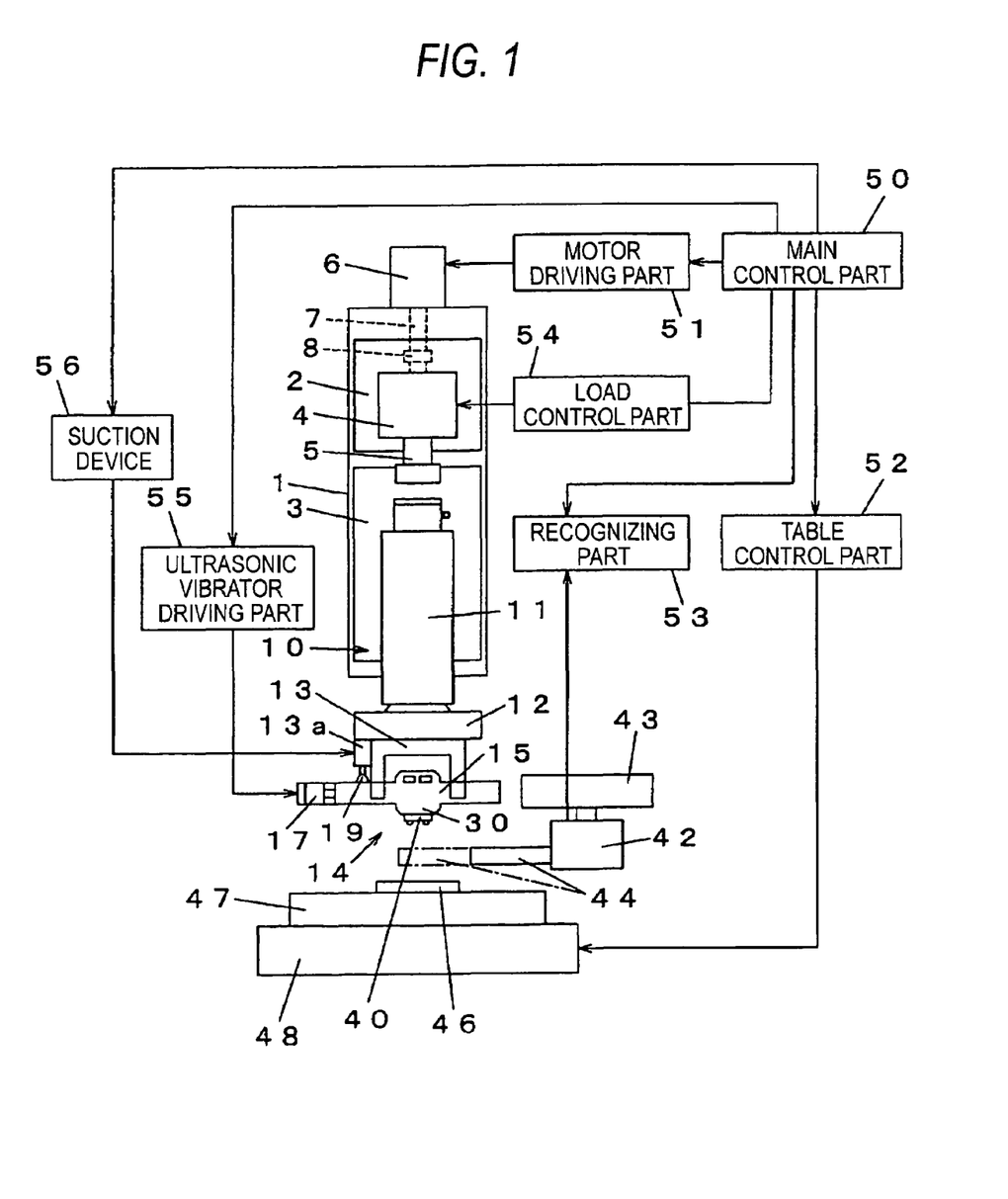
FIG. 1 is a front view of a bonding device for electronic parts according to a first embodiment of the present invention.
Figure 2:
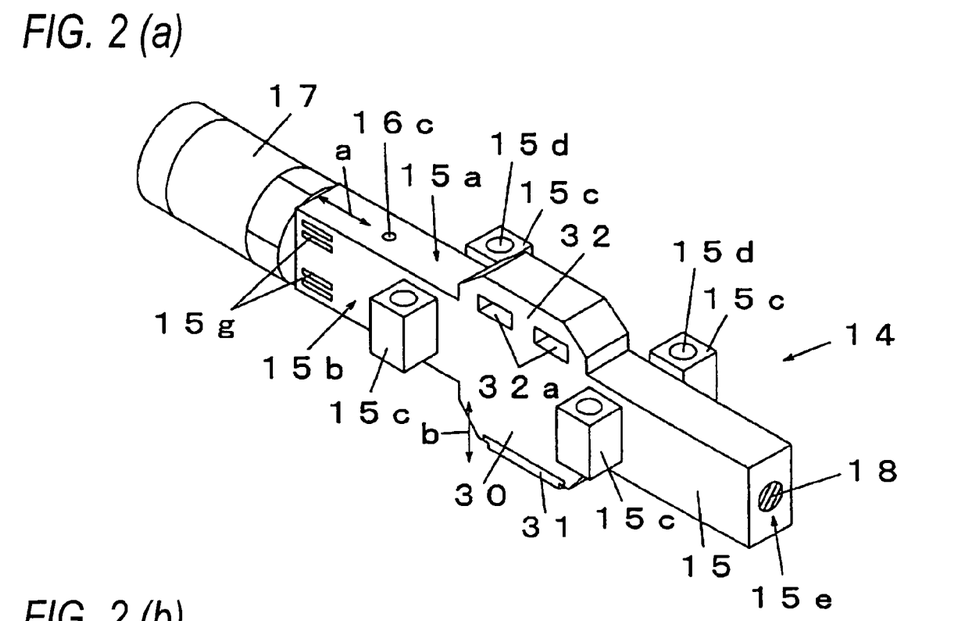
FIG. 2(a) is a perspective view of a bonding tool for the electronic parts according to the first embodiment of the present invention.
FIG. 2(b) is a partly upper and lower inverted perspective view of the bonding tool for the electronic parts according to the first embodiment of the present invention.
Figure 3:
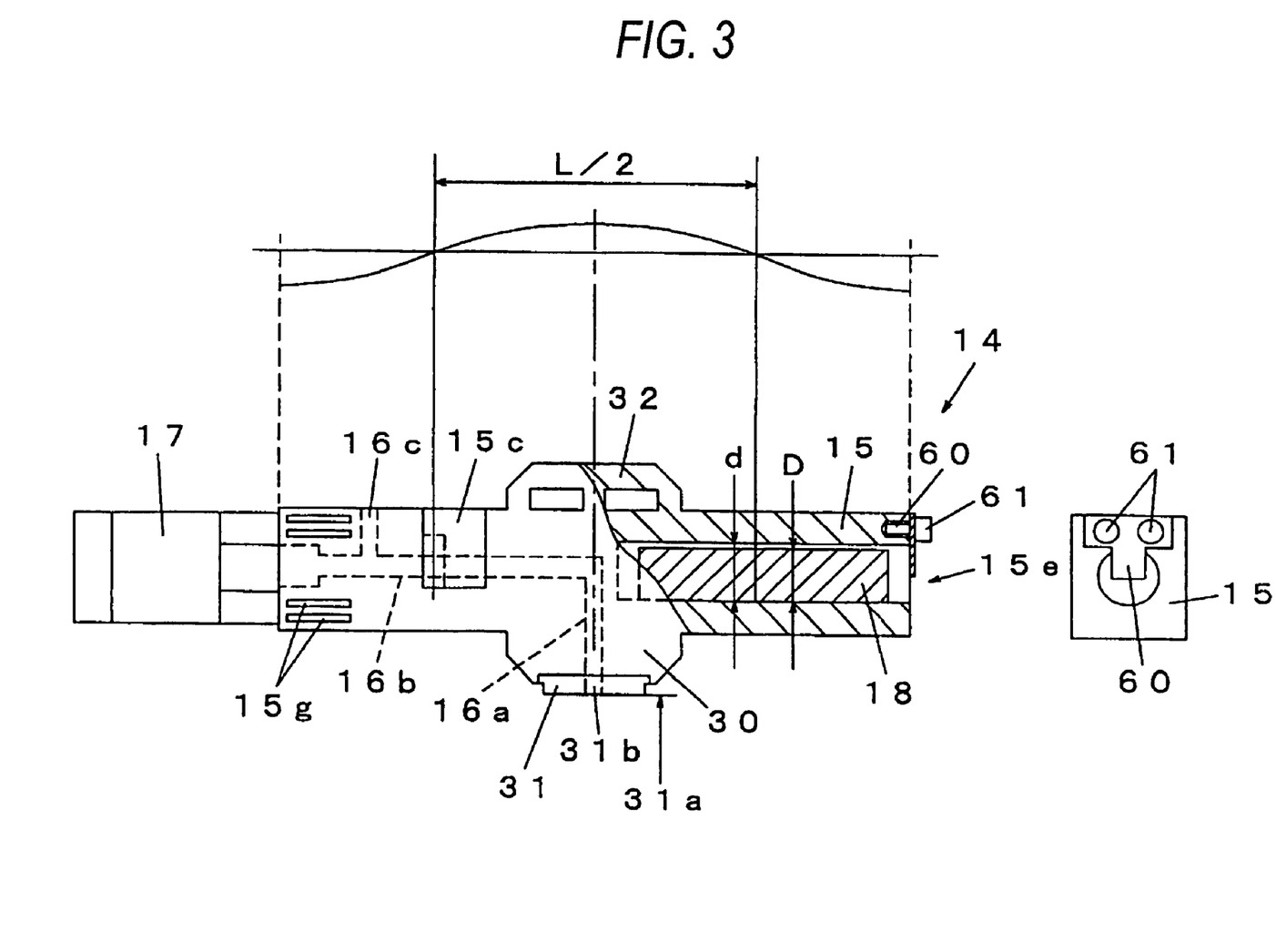
FIG. 3 is a front view of the bonding tool for the electronic parts according to the first embodiment of the present invention.

Now, embodiments of the present invention will be described by referring to the drawings. FIG. 1 is a front view of a bonding device according to a first embodiment of the present invention. FIG. 2(a) is a perspective view of a bonding tool according to the first embodiment of the present invention. FIG. 2(b) is a pertly upper and lower inverted perspective view of the bonding tool according to the first embodiment of the present invention. FIG. 3 is a front view of the bonding tool of electronic parts according to the first embodiment of the present invention.

Initially, referring to FIG. 1, the entire structure of the bonding device for the electronic parts is described below. A first lifting and lowering plate 2 and a second lifting and lowering plate 3 are provided in front of a support frame 1 so as to be freely lifted and lowered in the front surface thereof. A cylinder 4 is mounted on the first lifting and lowering plate 2. A rod 5 of the cylinder 4 is connected to the second lifting and lowering plate 3. A bonding head 10 is mounted on the second lifting and lowering plate 3. On the upper surface of the support frame 1, a z-axis motor 6 is provided. The Z-axis motor 6 rotates a vertical feed screw 7. The feed screw 7 is screwed to a nut 8 provided in a back surface of the first lifting and lowering plate 2. Accordingly, when the Z-axis motor 6 drives to rotate the feed screw 7, the nut 8 moves vertically along the feed screw 7 and the first lifting and lowering plate 2 and the second lifting and lowering plate 3 also move upward and downward.

In FIG. 1, a board 46 whose upper surface serves as a surface to be bonded for the electronic parts is mounted on a board holder 47. The board holder 47 is mounted on a table 48. The table 48 is a movable table to horizontally move the board 46 in a direction of X or a direction of Y and position the board 46 at a prescribed position. The table 48 serves as positioning means for moving the board 46 relative to the electronic parts 40.

A camera 42 that is mounted on a single axis table 43. A tube 44 is extending forward from the camera 42. The camera 42 is moved forward along the single-axis table 43 to allow the end part of the tube 44 to be located between the electronic parts 40 having bumps sucked and held by the lower surface of a bonding tool 14 and the board 46 as shown by a chain line. Under this state, the positions of the electronic parts 40 and the board 46 are observed by the camera 42.

A recognizing part 53 that recognizes the image of the electronic parts 40 or the board 46 picked up by the camera 42 to detect the positions of them. A main control part 50 controls the lifting and lowering operation of the Z-axis motor 6, that is, the bonding head 10 through a motor driving part 51 and positions the table 48, that is, the elevation of the board 46 through a table control part 52. Further, the main control part 50 calculates a deviation between the electronic parts 40 and the board 46 in a horizontal plane from the positions of the electronic parts 40 and the board 46 detected by the recognizing part 53. Then, the main control part 50 drives the table 48 so as to correct the deviation. Further, a load control part 54 and a suction device 56 are connected to the main control part 50.

The cylinder 4 as a pressing means is connected to the main control part 50 through the load control part 54. Thus, the protruding force of the rod 5 of the cylinder 4, that is, a pressing load for pressing the bumps of the electronic parts 40 to the board 46 by the bonding tool 14 is controlled. The suction device 56 sucks and/or separates the electronic parts 40 by the bonding tool 14 in accordance with a command from the main control part 50. A vibrator 17 is connected to the main control part 50 through an ultrasonic vibrator driving part 55. The vibrator 17 is driven by the ultrasonic vibrator driving part 55 in accordance with a command from the main control part 50 to apply an ultrasonic vibration to the bonding tool 14. At this time, the vibration of the bonding tool 14 resonates and a phase difference between voltage and electric current, applied to the vibrator 17 becomes substantially zero.

A holder 12 is connected to the lower end part of the main body 11 of the bonding head 10. A block 13 is mounted on the holder 12 and the bonding tool 14 is fixed to the block 13. A protruding part 13a in the side part of the block 13 is connected to the suction device 56. The protruding part 13a is provided with a suction pad 19. As described below, the suction pad 19 abuts on a horn 15 to suck and hold the electronic parts 40 by the suction device 56.

Now, referring to FIGS. 2 and 3, the bonding tool 14 will be described below. FIG. 2(a) is a perspective view showing the bonding tool removed from the block 13 from an obliquely upper part. FIG. 2(b) partly shows the horn 15 under a state that the upper and lower parts of the bonding tool 14 are inverted. FIG. 3 is a front view of the bonding tool 14 and shows a graph of the amplitude of a stationary wave vibration induced on the horn 15 by the vibrator 17.

As shown in FIG. 2(a), the bonding tool 14 has the transversely elongated horn 15 as a main body. The horn 15 is made of, for example, a metal material (for instance, stainless steel, aluminum, titanium, etc.) and is formed in a rod shape rectangular in section. In one side end part of the horn 15, the vibrator 17 is mounted. The dimensions of height and width of the rectangular section may be changed continuously or stepwise along the longitudinal direction of the horn. Thus, the vibration applied by vibration applying means can be adjustably enlarged or reduced in the horn 15. The vibrator 17 is driven to apply a longitudinal vibration to a first direction (a direction shown by an arrow mark a) along the longitudinal direction of the horn 15. Accordingly, the vibrator 17 serves as the vibration applying means for applying the vibration to the first direction along the longitudinal direction of the horn 15.

On both side surfaces 15b of the horn 15, thin ribs 15c are respectively formed integrally with the horn 15 at two positions split with respect to central positions. A dimension between the two ribs 15c is set to be equal to a half of the wavelength (L/2) of the longitudinal vibration applied by the vibrator 17 in order to minimize the attenuation of the vibration due to fixing of a vibration component (see FIG. 3). This dimension may be set to any value when the attenuation of the vibration is located within an allowable range and may not be necessarily equal to L/2.

The ribs 15c protrude outward from the horn 15. Bolts (An illustration is omitted) are inserted into attaching holes 15d provided in the ribs 15c to be fastened to the block 13. Thus, the horn 15 is fixed to the block 13 under a close sided condition. That is, the four (two sets) ribs 15c serve as fixing parts for fixing the horn 15 to the block 13.

In fixing the horn 15, since the four ribs 15c are symmetrically arranged with respect to the central point of the horn 15, the bonding tool 14 can be fixed to the block 13 with good balance. Further, a load exerted on the horn 15 by the pressing means can be supported with good balance. The number of ribs 15c is not limited to four. For instance, two ribs may be provided in the upper parts of a node of the horn 15.

Briefly, the load exerted on the horn 15 may be supported with good balance. Under this state, any number of ribs may be employed. Further, under the state that the bolts are inserted into the attaching holes 15d, the bolts do not protrude from the lower surface of the horn 15. Thus, the horn 15 can be fixed to the block without interfering with the electronic parts on the board upon bonding.

In the substantially central position of the two sets (four) of ribs 15c, a protruding part 30 protrudes in a second direction (shown by an arrow mark b) perpendicular to the first direction. The material of the protruding part 30 is desirably the same material as that of the horn 15 so that the protruding part 30 may be formed integrally with the horn 15. However, the material of the protruding part may be different from that of the horn. In the case of the different material, the form and dimension of the protruding part 30 are set by considering the difference in density, Young's modulus and Poisson's ratio between the material of the horn 15 and the material of the protruding part 30.

On the end part of the protruding part 30, a bonding operation part 31 abutting on the electronic parts 40 as an object to be bonded is provided. While the electronic parts 40 abuts on the bonding operation part 31, a pressing load is exerted on the bonding tool 14 so that the bumps of the electronic parts 40 are pressed to the board 46. Then, under this state, the vibrator 17 is driven to apply the longitudinal vibration to the horn 15 to bond the electronic parts 40 under pressure to the board 46 due to the load and the vibration. At this time, since the protruding part 30 is located at the central position of the four ribs 15c, a uniform pressing state is realized even for a large parts as an object that requires a large pressing load.

As shown in FIG. 2(b), on a bonding operation surface 31a of a lower surface of the bonding operation part 31, a suction hole 31b is opened. As shown in FIG. 3, the suction hole 31b communicates with a suction hole 16c (see FIG. 2(a)) opened on an upper surface 15a of the horn 15 through suction passages 16a and 16b formed in the horn 15.

While the bonding tool 14 is fixed to the block 13, the suction pad 19 provided in the protruding part 13 abuts on the upper surface 15a of the horn 15 (see FIG. 1), the suction hole 31b communicates with the suction pad 19 through the suction passages 16a and 16b and the suction hole 16c. Accordingly, the suction device 56 (see FIG. 1) connected to the suction pad 19 is driven to suck air so that a vacuum can be sucked from the suction hole 31b to suck and hold the electronic parts 40 under the vacuum on the bonding operation surface 31a. That is, the protruding part 30 has both a function for pressing the electronic parts 40 to the board 46 and a function as a sucker abutting on the upper surface of the electronic parts 40 to suck and hold the electronic parts 40.

In the side opposite to the protruding part 30 in the longitudinal direction of the horn 15, a vibration balance part 32 is provided that protrudes and has the substantially same form as that of the protruding part 30. The material of the vibration balance part 32 is desirably the same material as that of the horn 15 so that the vibration balance part 32 maybe formed integrally with the horn 15. The material of the vibration balance part 32 may be different from that of the horn. In the case of the different material, the form and dimension of the vibration balance part 32 are set by considering the difference in density, Young's modulus and Poisson's ratio between the material of the horn 15 and the material of the vibration balance part 32.

The vibration balance part 32 is provided to maintain the vertical vibration balance of the horn 15 by mainly holding a mass balance in the bonding tool 14. A quantity of balance can be adjusted in accordance with the positions, forms and sizes of through holes 32a passing through in the direction of thickness of the horn. This vibration balance part 32 allows a vibration distribution and a mass distribution of the horn 15 to be substantially symmetrical with respect to a central axis of the first direction and a uniform transmission of vibration to be ensured.

Now, the vibration characteristics of the horn 15 will be described below. The vibrator 17 is driven by the ultrasonic vibrator driving part 55 with a frequency suitable for the horn 15 (A frequency is satisfactory under which the horn 15 is brought into a resonant state. Further, a frequency is desirably 40 kHz or higher and 70 kHz or lower and desirably about 60 kHz in view of bonding the electronic parts.) to apply the longitudinal vibration in the first direction to the horn 15 and form the resonant state. Thus, the stationary wave vibration shown in a graph of FIG. 3 is generated in the horn 15.

That is, under the stationary wave vibration of the horn 15, the positions of the ribs 15c constitute those of nodes having substantially no horizontal displacement. The position of the protruding part 30 located at the central position of the ribs 15c corresponds to an antinode in which horizontal amplitude becomes a maximum. The position of the protruding part 30 desirably corresponds to the position of the antinode of the stationary wave vibration. However, as long as the protruding part 30 is located at the substantially central position of the ribs 15*c* for fixing the horn 15, the protruding part 30 may be slightly shifted from the position of the antinode of the stationary wave vibration.

The vibration of the protruding part 30 is transmitted to the electronic parts 40 through the bonding operation surface 31*a*. In the transmission of vibration to the electronic parts 4, not only the longitudinal vibration applied to the horn 15 by the vibrator 17, but also a bending vibration induced on the protruding part 30 by the longitudinal vibration of the horn 15 is superimposed thereon and transmitted to the electronic parts 40 as described below.

Now, a heating unit provided in the horn 15 will be described below. As shown in FIG. 3, in the right half part of the horn 15, a mounting hole 15*e* circular in its section is provided in the longitudinal direction (the first direction). A heater 18 as a rod shaped heating means is inserted into the mounting hole 15*e* along the longitudinal direction. The heater 18 is operated to heat the horn 15. Thus, the electronic parts 40 is heated through the bonding operation surface 31*a*. Under this heating, the electronic parts 40 can be efficiently bonded under pressure to the board 46 in a short time in the bonding operation.

In the vicinity of a left end face of the horn 15, a plurality of slits 15*g* are provided in a horizontal direction (a vertical direction relative to the surface of a sheet in FIG. 3) perpendicular to the longitudinal direction. When the heater 18 is continuously operated, heat generated from the heater 18 is transmitted to the horn 15 and further to the vibrator 17 to raise the temperature of the vibrator 17. Since the temperature rise of the vibrator 17 constitutes a factor to vary the vibration characteristics, the heat transfer to the vibrator 17 is desirably suppressed as much as possible. Therefore, in the horn 15 shown in this embodiment, the slits 15*g* are provided before the vibrator 17 in the heat transfer direction, so that the heat transmitted through the horn 15 is radiated by the slits 15*g* to reduce a quantity of heat transfer to the vibrator 17 as much as possible. That is, the transversely elongated slits 15*g* serve as a vent part for preventing the heat transfer to the vibrator formed in the horn 15 between the vibrator 17 and the bonding operation part 31. Cooling means for cooling the vent part is desirably provided. As the cooling means, air supply means for supplying air to the slits 15*g* may be employed. As the air supply means, means for supplying compressed air through a tube or means for supplying air by a fan may be employed.

Now, a method for mounting the heater 18 on the horn 15 will be described below. The inside diameter d of the mounting hole 15*e* is set to be slightly larger than the outside diameter D of the heater 18. Under a state that the heater 18 is inserted into the mounting hole 15*e*, a small space is held between the outer surface of the heater 18 and the inner surface of the mounting hole 15*e*. That is, the heater 18 is attached to the horn 15 under a state that the heater is not fixed to the horn 15 to be movable, that is, the heater is attached to the horn 15 in a loose attaching state.

To the side end part of the opening of the mounting hole 15*e* at the end of the horn 15, an end plate 60 is fixed by bolts 61 while a space to the end face of the heater 18 is maintained. Thus, the heater 18 is prevented from slipping off from the mounting hole 15*e*. That is, the end plate 60 serves as a slipping-off preventing means for preventing the heater 18 from slipping off from the mounting hole 15*e*.

As described above, the heater 18 is attached to the horn in a loose attaching state so that contact pressure for pressing the heater 18 to the inner surface of the mounting hole 15*e* is not generated. Accordingly, even when the horn 15 expands and/or contracts due to a temperature change, a mounting state is not varied and a constant mounting state is always maintained. Thus, the rigidity distribution of the entire part of the horn 15 is not varied during a process that a bonding operation is repeatedly performed to maintain stable vibration characteristics.

Further, since the heater 18 is not fixed to the horn 15, an ultrasonic vibration is not directly transmitted to the heater 18. Accordingly, the heater 18 is hardly broken due to the vibration so that the life of parts of the heater 18 can be extended.

(Second Embodiment)

Figure 4:
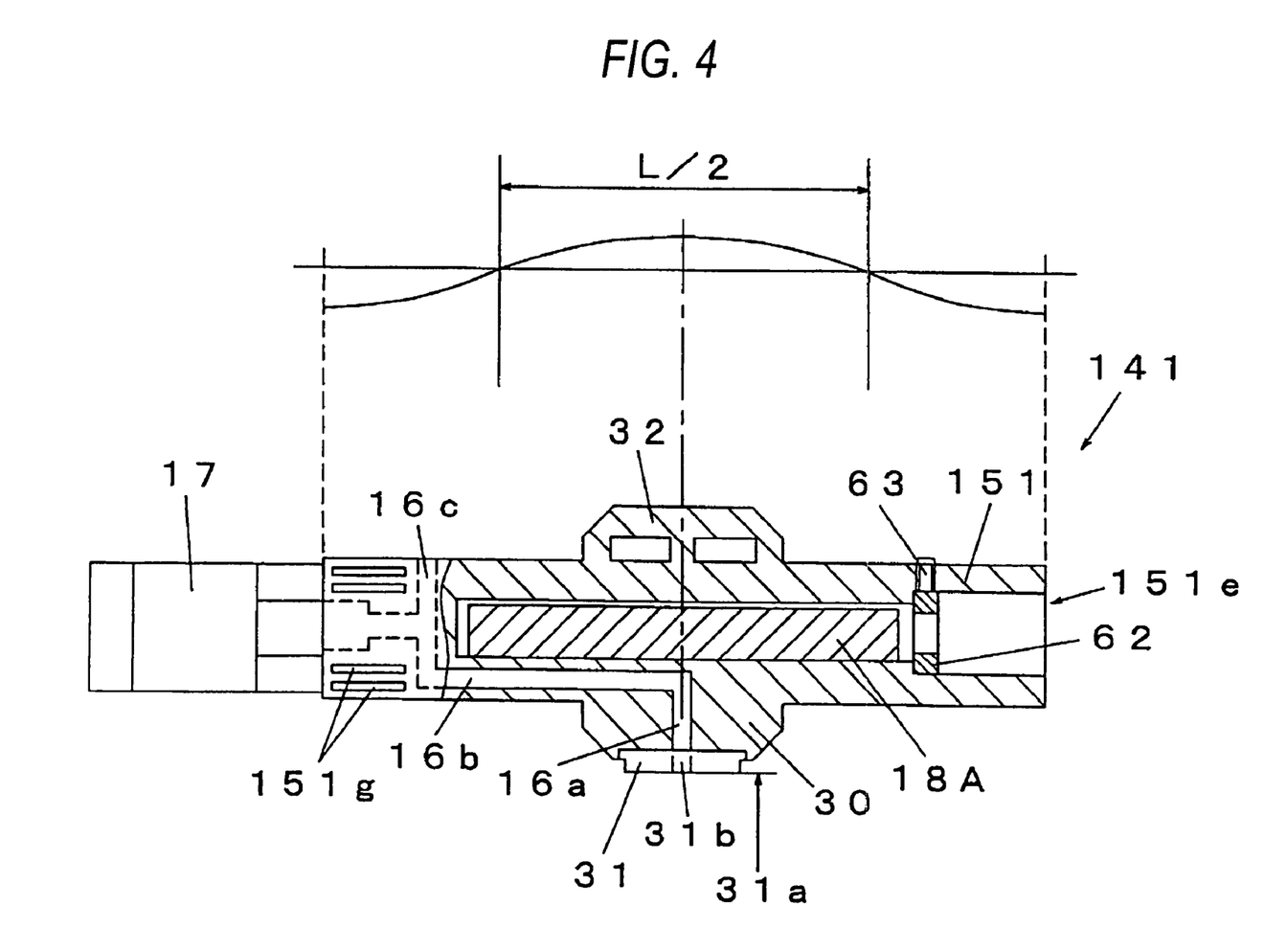
FIG. 4 is a front sectional view of a bonding tool for electronic parts according to a second embodiment of the present invention.

FIG. 4 is a front sectional view of a bonding tool according to a second embodiment of the present invention. According to the second embodiment, in a bonding tool 141 having the same outer form and the same structure of the outer form as those of the bonding tool 14 shown in the first embodiment, a heater 18A the same as or larger than the heater 18 of the first embodiment is mounted in a substantially symmetrical arrangement in a horn 151. At this time, the heater 18A is provided in a part corresponding to the antinode part of the vibration of the horn 151.

In FIG. 4, in the horn 151, a mounting hole 151*e* circular in its section is provided in a longitudinal direction (a first direction) from a right end face to a part before a suction hole 16*c*. In the mounting hole 151*e*, the heater 18A as a rod shaped heating means is inserted along the longitudinal direction. The function and the mounting method of the heater 18A are the same as those of the heater 18 shown in the first embodiment. The heater 18A is mounted on the horn with a slight space held between the outer surface of the heater 18A and the inner surface of the mounting hole 151*e*. In the vicinity of the left end face of the horn 151, slits 151*g* the same as the slits 15*g* of the first embodiment are provided.

The slipping-off of the heater 18A is prevented in such a way that a collar member 62 is fitted to the inner surface of the mounting hole 151*e* and the collar member 62 is fixed to the horn 151 by a set bolt 63. That is, the collar member 62 serves as a slipping-off preventing means for preventing the heater 18A from slipping off from the mounting hole 151*e*. In this structure, stable vibration characteristics can be effectively assured similarly to the first embodiment. As a method for preventing the slip-off of the heater, a method for projecting a bolt into the mounting hole 151*e* (see a third embodiment) may be employed in place of a method for fitting the collar member 62 to the mounting hole. In this case, the bolt serves as slipping-off preventing means.

(Third Embodiment)

Figure 5:
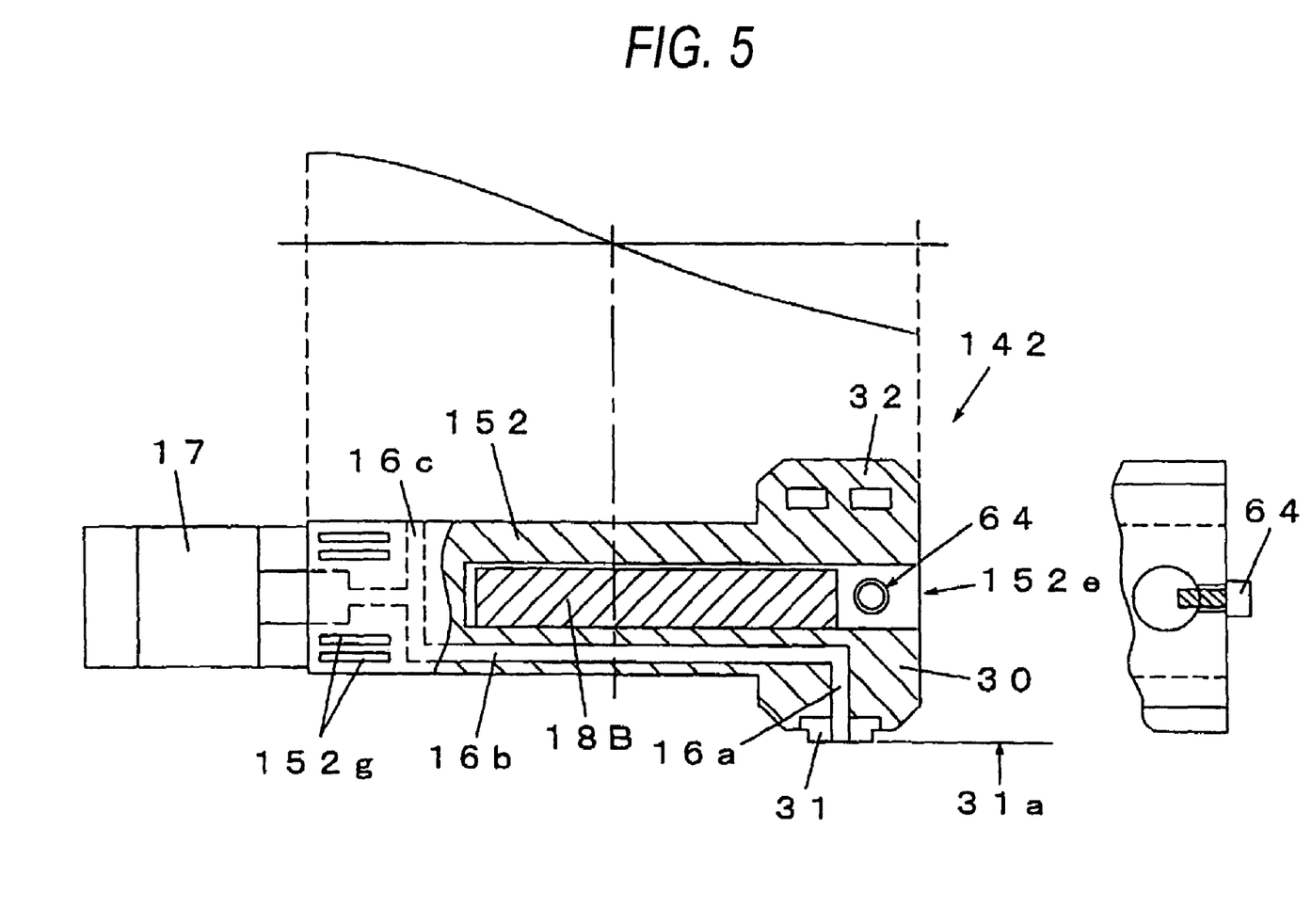
FIG. 5 is a front sectional view of a bonding tool for electronic parts according to a third embodiment of the present invention.

FIG. 5 is a front sectional view of a bonding tool according to a third embodiment of the present invention. In the first and second embodiments, examples of a close sided support type bonding tool are shown in which the horn is fixed and supported at a plurality of support positions in the longitudinal direction. However, the present invention is not limited to the close sided support type bonding tool and may be applied to an open sided bonding tool as shown in FIG. 5.

In FIG. 5, the open sided bonding tool 142 has a structure that the right side part is cut from the protruding part 30 in the bonding tool 141 shown in the second embodiment. The bonding tool 142 is fixed and supported at a position corresponding to the node of a stationary wave like the case of the close sided type bonding tool and has a structure that a bonding operation part 31 is arranged at a position corresponding to the antinode of the stationary wave.

In a horn 152, a mounting hole 152e circular in its section is provided in a longitudinal direction (a first direction) from a right end face to a part before a suction hole 16c. In the mounting hole 152e, a heater 18B as a rod shaped heating means is inserted along the longitudinal direction. The function and the mounting state of the heater 18B are the same as those of the heater 18 shown in the first embodiment. The heater 18B is mounted on the horn with a slight space held between the outer surface of the heater 18B and the inner surface of the mounting hole 152e. In the vicinity of the left end face of the horn 152, slits 152g the same as the slits 15g of the first embodiment are provided.

The slipping-off of the heater 18B is prevented in such a way that a bolt 64 protrudes into the mounting hole 152e to function as a stopper. That is, the bolt 64 serves as a slipping-off preventing means for preventing the heater 18B from slipping off from the mounting hole 152e. In this structure, stable vibration characteristics can be effectively assured similarly to the first embodiment. As a method for preventing the slip-off of the heater, a method for attaching an end plate to the end part of an opening side of the horn 152 may be used as shown in FIG. 3 in plate of using the bolt. In this case, the end plate serves as a slipping-off preventing means.

As described above, in the bonding tool shown in each of the embodiments of the present invention, the heater for heating is inserted into the mounting hole provided in the first direction along the longitudinal direction of the horn. In this structure, the slight space is held between the outer surface of the heater and the inner surface of the mounting hole. Thus, the prescribed mounting state can be always maintained and the rigidity distribution of the entire part of the horn can be prevented from being varied. Accordingly, the stable vibration characteristics can be realized.

According to the present invention, since the structure that the rod shaped heating means for heating the bonding tool is inserted in the first direction along the longitudinal direction of the horn is employed, an influence of the propagation of the vibration in the horn can be reduced as much as possible. Even when the heating means with a high output is incorporated in the horn of a small size, the highly efficient heating operation can be made compatible with the realization of the stable vibration characteristics.

Further, according to the present invention, in the structure that the heating means is inserted into the mounting hole provided in the horn, the heating means is mounted with the space maintained between the inner surface of the mounting hole and the heating means. Thus, a constant mounting state can be always maintained to prevent the variation of the rigidity distribution of the entire part of the horn. Thus, the stable vibration characteristics can be realized.

What is claimed is:

1. A bonding device for bonding an object to be bonded under pressure to a surface to be bonded by allowing a load and vibration to act on the object to be bonded, the bonding device comprising:
   a bonding tool, abutting on the object to be bonded; and
   a pressing unit, pressing the bonding tool to the object to be bonded;
   wherein the bonding tool includes:
      a transversely elongated horn;
      a vibrator, applying a longitudinal vibration to the horn in a first longitudinal direction along the longitudinal direction of the horn;
      a protruding part, protruding from the horn in a second direction substantially perpendicular to the first direction;
      a bonding operation part, provided in the end part of the protruding part to abut on the object to be bonded; and
      a heating unit, inserted into a mounting hole provided in the horn; and
      wherein the heating unit is mounted into the mounting hole in a loose state with a substantial space enough to prevent a contact pressure of the heating unit against the inner surface of the mounting hole, whereby an ultrasonic vibration is not directly transmitted to the heating unit.

2. The bonding device according to claim 1, wherein a vent part is provided for preventing the transfer of heat to the vibrator in the horn between the vibrator and the bonding operation part.

3. The bonding device according to claim 2, wherein the vent part is a transversely elongated slit in the first direction.

4. The bonding device according to claim 1, wherein the heating unit is provided in a part corresponding to an antinode of the vibration of the horn.

5. A bonding tool for bonding an object to be bonded under pressure to a surface to be bonded by allowing a load and vibration to act on the object to be bonded, the bonding tool comprising:
   a transversely elongated horn;
   a vibrator, applying a longitudinal vibration to the horn in a first direction along the longitudinal direction of the horn;
   a protruding part, protruding from the horn in a second direction substantially perpendicular to the first direction;
   a bonding operation part, provided in the end part of the protruding part to abut on the object to be bonded; and
   a heating unit, inserted into a mounting hole provided in the horn;
   wherein the heating unit is mounted into the mounting hole in a loose state with a substantial space enough to prevent a contact pressure to the heating unit against the inner surface of the mounting hole, whereby an ultrasonic vibration is not directly transmitted to the heating unit.

6. The bonding tool according to claim 5, wherein a vent part is provided for preventing the transfer of heat to the vibrator in the horn between the vibrator and the bonding operation part.

7. The bonding tool according to claim 6, wherein the vent part is a transversely elongated slit in the first direction.

8. The bonding tool according to claim 5, wherein the heating unit is provided in a part corresponding to a antinode of the vibration of the horn.

9. A bonding tool for bonding an object to be bonded under pressure to a surface to be bonded by allowing a load and vibration to act on the object to be bonded, the bonding tool comprising:
   a transversely elongated horn;
   a vibrator, applying a longitudinal vibration to the horn in a first direction along the longitudinal direction of the horn;
   a protruding part, protruding from the horn in a second direction substantially perpendicular to the first direction;
   a bonding operation part, provided in the end part of the protruding part to abut on the object to be bonded and;
   a rod shaped heating unit, inserted into the first direction of the horn, from the side which is opposite to the vibrator where by the rod shaped heating unit is not apt to interrupt the vibration.

10. The bonding tool according to claim 9, wherein a vent part is provided for preventing the transfer of heat to the vibrator in the horn between the vibrator and the bonding operation part.

11. The bonding tool according to claim 10, wherein the vent part is a transversely elongated slit in the first direction.

12. The bonding tool according to claim 9, wherein the heating unit is provided in a part corresponding to an antinode of the vibration of the horn.

* * * * *